United States Patent
Hergenrother et al.

(10) Patent No.: US 6,821,851 B2
(45) Date of Patent: Nov. 23, 2004

(54) METHOD OF MAKING ULTRA THIN BODY VERTICAL REPLACEMENT GATE MOSFET

(75) Inventors: John Michael Hergenrother, Short Hills, NJ (US); Pranav Kalavade, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/649,140

(22) Filed: Aug. 27, 2003

(65) Prior Publication Data

US 2004/0152269 A1 Aug. 5, 2004

Related U.S. Application Data

(62) Division of application No. 10/164,202, filed on Jun. 6, 2002, now Pat. No. 6,635,924.

(51) Int. Cl.[7] .......................................... H01L 21/8236
(52) U.S. Cl. ...................... 438/268; 438/270; 438/271; 257/328; 257/333
(58) Field of Search ................................ 438/212, 268, 438/270–271; 257/328, 329–334

(56) References Cited

U.S. PATENT DOCUMENTS 6,020,257 A * 2/2000 Leedy ........................ 438/626
6,197,641 B1 * 3/2001 Hergenrother et al. ...... 438/268

OTHER PUBLICATIONS

Ishiwara et al., *Lateral solid phase epitaxy in selectively P–doped amorphous Si films*, Appl. Phys. Lett., vol. 49, No. 20, p. 1365 (Nov. 1986) (Abstract only).
Ishiwara et al., *Selective Surface Doping Method of P Atoms in Lateral Solid Phase Epitaxy...*, Jpn. J. Appl. Phys., vol. 31, p. 1695 (Jun. 1992).
Dan et al., *Lateral solid phase epitaxy of amorphous Si films by selective surface doping method of P atoms*, Appl. Phys. Lett., vol. 53, No. 26, p. 2626 (Dec. 1988).
Greene et al., *Thin Single Crystal Silicon on Oxide by Lateral Solid Phase Epitaxy of Amorphous Silicon and Silicon Germanium*, Mat. Res. Soc. Symp. Proc., vol. 609, p. A9.31 (2000).

(List continued on next page.)

*Primary Examiner*—Dung A. Le

(57) ABSTRACT

A method of fabricating a VRG MOSFET includes the steps of: (a) forming a VRG multilayer stack; (b) forming a trench in the stack; (c) depositing an ultra thin, amorphous semiconductor (α-semic) layer on the sidewalls of the trench (portions of the ultra thin layer on the sidewalls of the trench will ultimately form the channel or ultra thin body (UTB) of the MOSFET); (d) forming a thicker, α-semic sacrificial layer on the ultra thin layer; (e) annealing the α-semic layers to recrystallize them into single crystal layers; (f) selectively removing the recrystallized sacrificial layer; and (g) performing additional steps to complete the VRG MOSFET. In general, the sacrificial layer should facilitate the recrystallization of the ultra thin layer into single crystal material. In addition, the etch rate of the sacrificial layer should be sufficiently higher than that the ultra thin layer so that the sacrificial layer can be selectively removed in the presence of the ultra thin layer after recrystallization. The latter condition is illustratively satisfied by doping the sacrificial layer and by not (intentionally) doping the ultra thin layer. In accordance with one embodiment of our invention, step (g) includes filling the trench with oxide to form a thick back oxide region. In accordance with another embodiment of our invention, step (g) includes depositing a thin oxide layer (the back oxide) in the trench and then filling the remainder of the trench with a polycrystalline region (the back gate). VRG MOSFETs fabricated in accordance with our invention are expected to be electrostatically scalable with precise dimensional control. In addition, they can be fully depleted. Novel UTB device designs are also described.

15 Claims, 4 Drawing Sheets

OTHER PUBLICATIONS

Choi et al., *Ultra–thin–body SOI MOSFET for Deep–sub–tenth Micron Era*, IEEE Electron Dev. Lett., vol. 21, No. 5, p. 254 (May 2000).

Subramanian et al, *A Bulk–Si–compatible Ultrathin SOI Technology for sub–100 nm MOSFETs*, Device Research Conf. Tech. Dig., p. 28 (1999).

Hergenrother et al, *The Vertical Replacement–Gate . . . Gate Length*, IEDM Tech. Dig., p. 75 (1999).

Oh et al, *50 nm Vertical Replacement–Gate (VRG) pMOSFETs*, IEDM Tech. Dig., p. 65 (2000).

Hergenrother et al, *50 nm Vertical Replacement–Gate (VRG) nMOSFETs with ALD . . . Dielectrics*, IEDM Tech. Dig., p. 51 (2001).

Hergenrother et al, *The Vertical Replacement–Gate MOSFET*, Proc. $2^{nd}$ European Workshop on the Ultimate Integration of Silicon (ULIS)., p. 1 (2001).

* cited by examiner

METHOD OF MAKING ULTRA THIN BODY VERTICAL REPLACEMENT GATE MOSFET

CROSS REFERENCE TO RELATED APPLICATIONS

The subject matter of the present application is a DIV of Ser. No. 10/164,202 filed Jun. 6, 2002, now U.S. Pat. No. 6,635,924.

BACKGROUND OF THE INVENTION

1. Field of the Invention

This invention relates to field effect transistors (FETs) and, more particularly, to metal-oxide-semiconductor (MOS) vertical FETs or vertical MOSFETs.

2. Discussion of the Related Art

It is widely recognized that the two principal challenges to continued miniaturization of MOSFETs are electrostatic scalability and critical dimension control. The vertical replacement gate (VRG) MOSFET provides precise control of all critical dimensions without lithography, while maintaining the essential features of advanced planar MOSFETs. The partially depleted (PD) VRG MOSFETs demonstrated to date are based on a thick, lithographically defined body. See, for example, J. M. Hergenrother et al., *IEDM Tech. Dig.*, p. 75 (1999); S-H. Oh et al., *IEDM Tech. Dig.*, p. 65 (2000); J. M. Hergenrother et al., *IEDM Tech. Dig.*, p. 51 (2001); J. M. Hergenrother et al., Proc. $2^{nd}$ *European Workshop on the Ultimate Integration of Silicon (ULIS)*, p. 1 (2001); and J. M. Hergenrother et al., U.S. Pat. No. 6,197,641 issued on Mar. 6, 2001, all of which are incorporated herein by reference. Since short-channel effects in PD-VRG MOSFETs are controlled by the doping level of the channel (known in the art as the body), it is difficult to provide electrostatic scalability in sub-35 nm devices; i.e., in devices in which the gate length is less than about 35 nm.

Thus, there is a need in the vertical MOSFET art for better electrostatic scalability of VRG MOSFETs.

There is also a need for a VRG MOSFET that can be fully depleted (FD).

BRIEF SUMMARY OF THE INVENTION

In accordance with one aspect of our invention, a method of fabricating a VRG MOSFET includes the steps of: (a) forming a VRG multilayer stack; (b) forming a trench in the stack; (c) depositing an ultra thin, amorphous semiconductor (α-semic) layer on the sidewalls of the trench and on the top of the stack (portions of the ultra thin layer on the sidewalls of the trench will ultimately form the channel or ultra thin body (UTB) of the MOSFET); (d) forming a thicker, α-semic sacrificial layer on the ultra thin layer; (e) annealing the α-semic layers to recrystallize them into single crystal semiconductor (x-semic) layers; (f) selectively removing the recrystallized sacrificial layer; and (g) performing additional steps to complete the VRG MOSFET. In general, the sacrificial layer should facilitate the recrystallization of the ultra thin layer into single crystal material. In addition, the etch rate of the sacrificial layer should be sufficiently higher than that of the ultra thin layer so that the sacrificial layer can be selectively removed in the presence of the ultra thin layer after recrystallization. The latter condition is illustratively satisfied by doping the sacrificial layer and by not (intentionally) doping the ultra thin layer.

In accordance with one embodiment of our invention, step (g) includes filling the trench with oxide to form a thick back oxide region In accordance with another embodiment of our invention, step (g) includes depositing a thin oxide layer (the back oxide) in the trench and then filling the remainder of the trench with a polycrystalline region (the back gate).

VRG MOSFETs fabricated in accordance with our invention are expected to be electrostatically scalable with precise dimensional control. In addition, they can be fully depleted.

In accordance with another aspect of our invention, an UTB-VRG-MOSFET includes an ultra thin x-semic layer disposed on the sidewalls of the trench. The ultra thin x-semic layer includes a pair of UTBs on opposing sidewalls adjacent the gate layer of the VRG stack, source/drain extensions above and below each UTB, and a plug that fills the remainder of the trench. In one embodiment of our invention, the plug is an oxide region (the back oxide); in another embodiment, the plug comprises a thin oxide layer (the back oxide) disposed on the ultra thin layer and a polycrystalline region (the back gate) that fills the remainder of the trench.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

Figure 3:
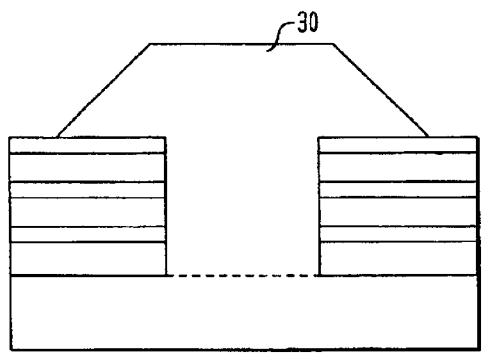
Figure 4:
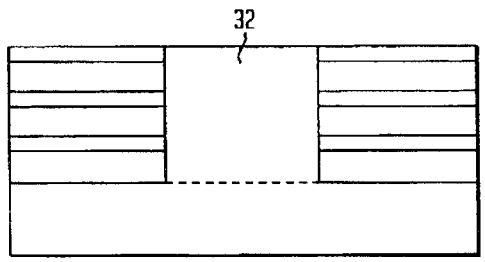

The dashed lines in FIGS. 5, 6, 8 and 9 indicate the location of the prior interface between an amorphous layer, later recrystallized into single crystal material, and the single crystal substrate, but in FIGS. 3 and 4 they indicate the location of the top surface of the substrate before the trench was filled with epitaxial material.

In the following detailed description we use the term undoped to mean that a layer/region is not intentionally doped; that is, a small amount of unintentional doping inevitably occurs from background contamination in the chamber/apparatus used to form the layer/region. For example, an undoped Si layer grown by CVD typically has a dopant concentration of about $10^{13}$–$10^{15}$ cm$^{-3}$.

DETAILED DESCRIPTION OF THE INVENTION

UTB-VRG-MOSFET Structures

Figure 1:
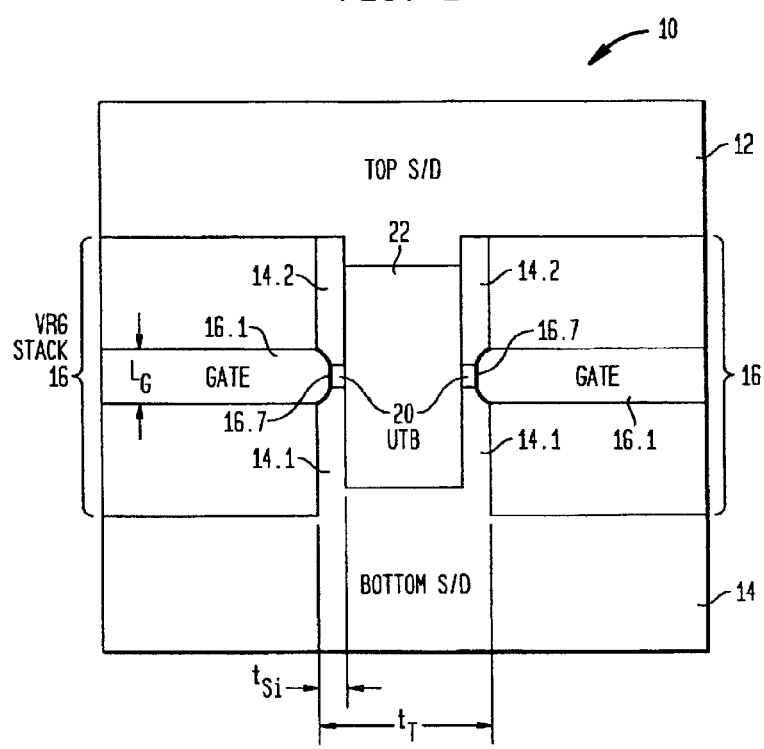
FIG. 1 is a schematic, cross sectional view of a VRG MOSFET in accordance with one embodiment of our invention.

With reference now to FIG. 1, a VRG MOSFET 10 in accordance with one embodiment of our invention comprises VRG stacks 16 disposed between top and bottom source/drain (S/D) regions 12 and 14, respectively. The two stacks are separated by a trench 18, which exposes a portion of the substrate 14 and is more clearly seen in FIG. 2. (The trench width $t_T$ represents a lithographic dimension involved in the fabrication of the device.) Thin single crystal semiconductor (x-semic) layers 14.1, 14.2 and 20 are formed on the sidewalls of the trench, and a buried oxide region 22 fills the remainder of the trench. The buried oxide region 22 is known at the back oxide. The ultra thin single crystal bodies (UTBs) 20 (e.g., <30 nm thick) serve as channels that conduct charge between the S/D regions 12 and 14. They are disposed on opposing sidewalls of the trench and adjacent gate layers 16.1. The single crystal layers 14.1 and 14.2 serve as S/D extensions. They are located above and below each of the UTBs.

Gate dielectrics 16.7 are located between the gate layers 16.1 and the UTBs 20. The ends of the gate layers penetrate slightly into the UTBs, making the UTBs slightly thinner than the S/D extensions. This design feature, referred to as a recessed channel, is well known in the art and has the advantage of reduced parasitic resistance. See, for example, Oh et al., *IEDM*, p. 65 (2000), which is incorporated herein by reference.

Figure 10:
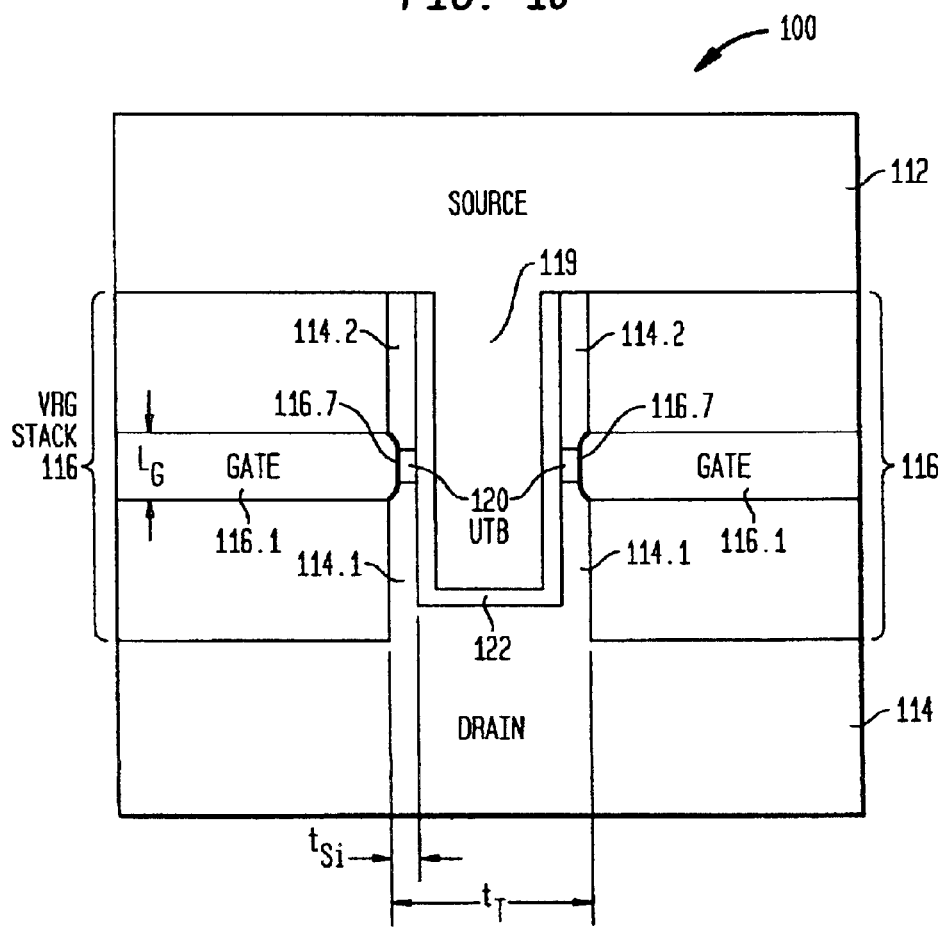
FIG. 10 is a schematic, cross sectional view of a VRG MOSFET in accordance with another embodiment of our invention.

Similarly, with reference to FIG. 10, a VRG MOSFET 100 in accordance with an alternative embodiment of our invention comprises VRG stacks 116 disposed between top source region 112 and the bottom drain region 114. The two stacks are separated by a trench similar to the one shown in FIG. 2. Thin x-semic layers 114.1, 114.2 and 120 are formed on the sidewalls of the trench. A thin oxide layer 122, known as a back oxide, is deposited over the thin single crystal layers, and a polycrystalline buried region 119 fills the remainder of the trench. The buried region 119 is known at the back gate, the ultra thin (e.g., <30 nm) single crystal bodies (UTBs) 120 serve as channels. They are disposed on opposing sidewalls of the trench and adjacent gate layers 116.1. The single crystal layers 114.1 and 114.2 serve as S/D extensions. They are located above and below each of the UTBs.

Gate dielectrics 116.7 are located between the gate layers 116.1 and the UTBs 120. The ends of the gate layers penetrate slightly into the UTBs, making the UTBs slightly thinner than the S/D extensions. This recessed channel design of FIG. 10 also has the advantage of reduced parasitic resistance, as described above in conjunction with the device of FIG. 1.

In the MOSFETs of both FIG. 1 and FIG. 10, an x-semic layer 14.1 is also formed on the bottom of the trench, but the single crystal nature of this portion of the layer is not critical from the standpoint of device performance.

Typically single crystal, polycrystalline, and/or amorphous semiconductors, as well as oxides and/or nitrides of these materials, are used to fabricate VRG-MOSFETs. The semiconductors may include, for example, Si, SiGe, or Ge. For purposes of illustration only, the following description assumes that the semiconductor material is Si. In this case, many of the semiconductor layers of these MOSFETs are single crystal silicon (x-Si), but the top S/D region 12 (FIG. 1) and the source region 112 (FIG. 10) known as a pad layers, are polysilicon. On the other, the VRG stacks 16, 116 are multilayered, including an undoped silicon oxide layer sandwiched between a pair of doped silicon oxide layers. The stacks also include a plurality of silicon nitride layers that serve as stop etch layers during processing; e.g., a silicon nitride layer is deposited on the top of the stack, and silicon nitride layers are disposed between adjacent oxide layers, as will be explained more fully later in conjunction with the description of FIG. 2.

The thickness $t_{Si}$ of the UTBs 20, 120 and the gate length $L_G$ are defined by deposited thin layers, which enables extremely precise control of these important dimensions.

Fully depleted UTB devices should have a body thickness $t_{Si} < L_G/3$ to ensure acceptable short-channel control. However, the ultra thin (e.g., <20 nm) x-Si layers required for sub-50 nm UTB-VRG devices cannot easily be formed with prior art direct Solid Phase Epitaxy (SPE) techniques, such as those described by V. Subramanian et al. *DRC Tech. Dig.*, p. 28 (1999), which entails deposition of α-Si followed by an anneal. We have found that such prior art approaches exhibit difficulties indicated by the following observations: (i) partial recrystallization of 20 nm α-Si layers produced stacking faults near the crystallization front only a short distance from the trench sidewall, and (ii) complete recrystallization produced a polysilicon layer, not a single crystal layer.

In contrast, we employ a novel SPE technique, which we refer to as Subtractive SPE (SSPE) to form the UTBs, as described below.

General Process

Figure 2:
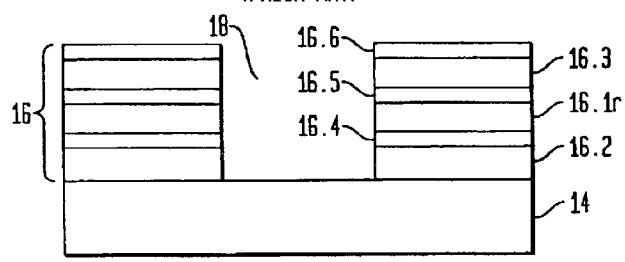
FIGS. 2–4 are schematic, cross sectional views depicting a prior art process for fabricating a VRG MOSFET.

We begin with a brief comparison of our SSPE technique with prior art techniques, such as those described by J. M. Hergenrother et al., *ULIS* (2001) and J. M. Hergenrother et al., U.S. Pat. No. 6,197,641, supra. Both our SSPE and the prior art SEG (selective epitaxial growth) approaches begin with the formation of a VRG stack 16, as shown in FIG. 2. The stack 16 includes an undoped silicon oxide (e.g., $SiO_2$) layer 16.1r disposed between doped silicon oxide (e.g., $SiO_2$) layers 16.2 and 16.3. Layer 16.1r will ultimately be replaced with material forming the gate layers (16.1 of FIG. 1 and 116.1 or FIG. 10) of the MOSFETs 10 and 100, as is well known in the VRG art. Layer 16.2 is deposited directly on the top surface of substrate 14, which is typically doped x-Si. In addition, the oxide layers are interleaved with silicon nitride (e.g., $Si_3N_4$) layers 16.4, 16.5 and 16.6, with the latter being the topmost layer of the stack.

Suitable photolithography and etching techniques are then used to form a trench 18 in the stack. The trench has sufficient depth to expose a portion of the top surface of substrate 14. The prior art process proceeds as shown in FIGS. 3–4; that is, SEG is used to fill the trench 18 with a thick x-Si body 30. Chemical-mechanical polishing (CMP) is then used to planarize the x-Si body so that it is essentially flush with the top of the stack, as shown by body 32 of FIG. 4. This approach, however, has realized only PD-VRG-MOSFETs.

Figure 5:
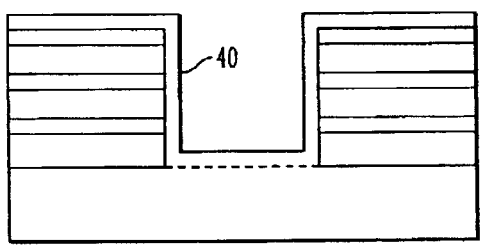
FIGS. 5–9 are schematic, cross sectional views depicting a process for fabricating a VRG MOSFET in accordance with one aspect of our invention.
Figure 6:
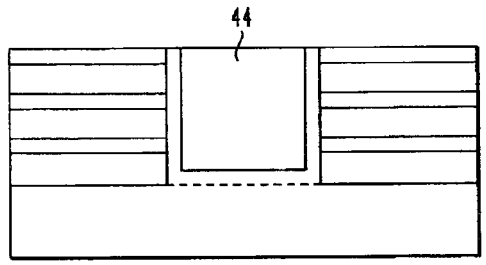

In contrast, our UTB-VRG process utilizes SSPE to form an ultra thin layer 40 along the sidewalls of the trench and over a portion of the top of the stack, as shown in FIG. 5. Subsequent steps form region 44 to fill in the remainder of the trench, as shown in FIG. 6 after CMP to planarize the intermediate stage of the device.

A suitable, thin dielectric layer is desirably formed on the exposed back surface of the layer 40. In the case of Si this dielectric is typically a thermal oxide. The thermal oxide ensures a high quality interface between the UTBs (20 in FIG. 1; 120 in FIG. 10), which are formed in layer 40 (FIG. 5), and the buried oxide region 22 (FIG. 1) or the back oxide layer 122 (FIG. 10), which are formed in region 44 (FIG. 6). In the case of other semiconductors, such as SiGe and Ge, on which it is more difficult to form thermal oxides, the dielectric may be formed as a deposited oxide (e.g., $SiO_2$, $HfO_2$) or as another insulating material (e.g., $Si_3N_4$).

Subtractive SPE

As mentioned previously, for purposes of illustration only, we assume that the semiconductor material is Si in the following description. Adaptation of the UTB-VRG-MOSFET fabrication process to other semiconductors, such as SiGe or Ge, is straightforward and well known to those skilled in the art.

Figure 7:
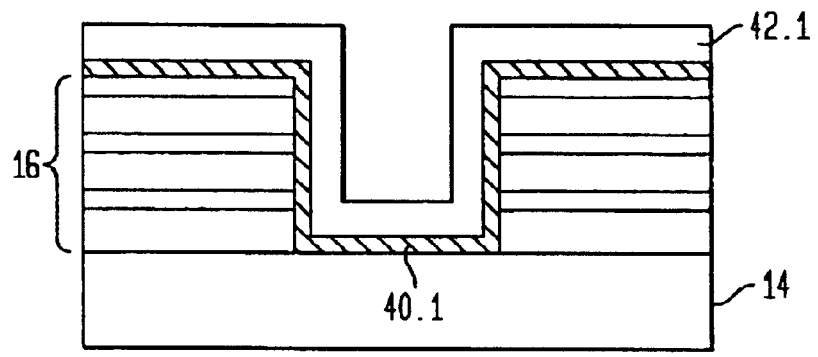
Figure 8:
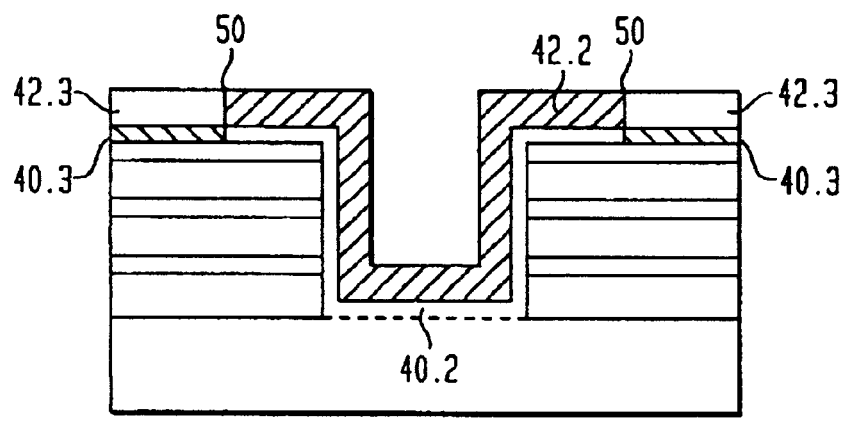
Figure 9:
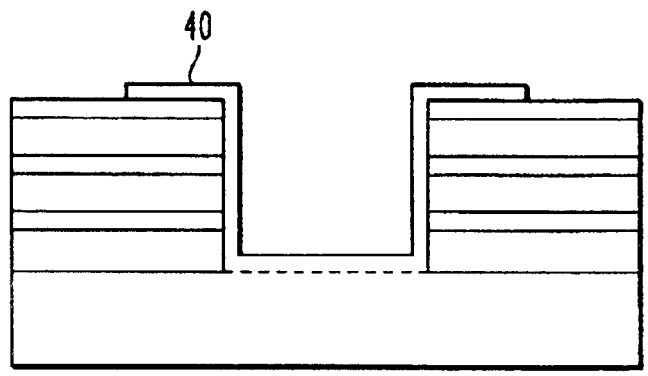

Beginning with the VRG trench structure of FIG. 2, our SSPE technique includes process steps that are illustrated by FIGS. 7–9; that is, (a) depositing an ultra thin first layer 40.1 of α-Si; and then (b) depositing a thicker sacrificial second layer 42.1 of α-Si. The sacrificial layer has two important characteristics: first, its etch rate is sufficiently higher than (e.g., >60:1) that of ultra thin layer 40.1 that the sacrificial layer can be selectively removed in the presence of layer 40.1 after both have been recrystallized; and second, it should be sufficiently thick to facilitate recrystallization of the ultra thin layer 40.1 into single crystal material.

The α-Si layers can formed in a number of different ways, and we have found that rapid thermal CVD is suitable.

For Si we have found that a total thickness of the combination of layers 40.1 and 42.1 of about 80 nm is suitable, whereas 20 nm is not. We estimate that the minimum thickness of the two layers should be about 50 nm. For example, since layer 40.1 is typically about 5–20 nm thick, then the sacrificial layer should be at least about 45–30 nm thick to the satisfy the approximate minimum, but would be about 75–60 nm thick for a typical composite thickness of 80 nm.

The desired differential etch rate (after recrystallization) between the two α-Si layers can be realized in a number of ways well known in the art. A preferred approach is to dope the two α-Si layers to sufficiently different levels [e.g., the first layer may be undoped or lightly doped (e.g., with a P dopant concentration as high as about $10^{18}$ cm$^{-3}$) and the second layer may be doped to a range of bout $1–4 \times 10^{20}$ cm$^{-3}$ (e.g., with P)]. This approach works well with wet chemical etchants such as HNA, which is discussed infra. Other dopants can also be utilized. Alternatively, the two α-Si layers may be doped with different dopants; e.g., the first α-Si layer may be doped with B and the second with P. In this case, a suitable etchant is a dry chlorine-based chemistry.

The next step (c) is to anneal the amorphous layers 40.1 and 42.1 so that they recrystallize into single crystal Si. The recrystallization front 50 (FIG. 8) shows the extent to which the layers are recrystallized; the recrystallized portions of α-Si layers 40.1 and 42.1 of FIG. 7 are now x-Si layers 40.2 and 42.2 in FIG. 8. Various annealing temperature/time parameters can be used, but we have found an anneal temperature of 575° C. in a nitrogen atmosphere for a few hours to be suitable. The next step (d) is to selectively remove both the remaining amorphous portions 40.3 and 42.3 of layers 40.1 and 42.1, respectively, as well as the doped x-Si portion 42.2 of original α-Si layer 42.1. Various selective etching techniques, both wet and dry, may be utilized, but we have found that HNA is highly selective (e.g., 60:1) with respect to the undoped x-Si layer 40.2. (HNA is a mixture of HF, nitric and acetic acids.)

At this stage our novel SSPE process has realized an ultra thin (e.g., <30 nm), undoped layer 40 of x-Si (corresponding to layer 40.2 of FIG. 8) that remains on the bottom and sidewalls of the trench, as well as on a portion of the top of the VRG stack, as shown in FIG. 9. From this point onward, the processes to complete the VRG-MOSFETs of FIGS. 1 & 10 diverge from one another.

To complete the device of FIG. 1 the next steps are: (e1) cleaning the back exposed surface of the x-Si layer 40 (FIG. 9) and then preferably growing a thin thermal oxide on it. This thermal oxide provides a good quality interface between the buried oxide 22 and the UTBs 20, which will be formed from layer 40; (f1) depositing a silicon oxide (e.g., TEOS or HDP) to fill the trench and overlay the top of the stack 16; (g1) using CMP to planarize the deposited oxide so that it is essentially flush with the top of the stack (cf. FIG. 6); (h1) if desired, using ion implantation to dope the portions of layer 40 that correspond to the UTBs 20; (i1) depositing an α-Si pad layer over the top of the stack; (j1) using ion implantation to dope the pad layer; (k1) annealing to cause the dopants to diffuse from the adjacent doped oxide layers 16.2 and 16.3 of the VRG stack into the S/D extensions 14.1 and 14.2. The annealing also causes the pad layer to recrystallize into polysilicon. The VRG processing to complete the MOSFET next follows the standard VRG fabrication steps described in the Hergenrother *ULIS* (2001) paper and patent, supra. For example, the MOSFET could be completed by following the process steps associated with, for example, FIGS. 2D–2J of the Hergenrother patent.

On the other hand to complete the device of FIG. 10, the next steps include the following: (e2) cleaning the back exposed surface of the x-Si layer 40 (FIG. 9) and then preferably growing a thin thermal oxide on it. This thermal oxide provides a good quality interface between the back oxide layer 122 and UTBs 120, which will be formed from layer 40; (f2) depositing the thin back oxide layer 122 on the thermal oxide and the top of the stack 16; (g2) depositing a thin α-Si layer on the deposited oxide layer; (h2) using ion implantation to dope the α-Si layer; dopants of either polarity can be used to adjust the threshold voltage of the device; (i2) depositing an undoped α-Si region so that it fills the trench and overlays the top of the stack; (The two α-Si regions will ultimately form the back gate region 119 of the device.) (j2) using CMP to planarize the deposited layers so that the device is essentially flush with the top of the stack (cf. FIG. 6); (k2) if desired, using ion implantation to dope the portions of layer 40 that correspond to the UTBs 20; (The α-Si in the trench also gets doped, but to a negligible degree.) (m2) annealing to cause dopants to diffuse from the adjacent doped oxide layers 16.2 and 16.3 of the VRG stack (FIG. 2) into the S/D extensions 14.1 and 14.2. (The annealing also causes the α-Si in the trench (the back gate region 119) to recrystallize into polysilicon and causes the dopants to diffuse nearly uniformly throughout the back gate region.); (n2) depositing an α-Si pad layer over the top of the stack; and (o2) using ion implantation to dope the pad layer. The pad layer serves as the source of the device. The doped polysilicon back gate region is included to further improve scalability (i.e., to reduce undesirable short-channel effects) of the embodiment of FIG. 10 with respect to that of FIG. 1. The VRG processing to complete the MOSFET next follows the standard VRG fabrication steps described in the Hergenrother *ULSI* 2001 paper and patent, supra. For example, the MOSFET could be completed by following the process steps associated with, for example, FIGS. 2D–2J of the Hergenrother patent. This subsequent processing causes the α-Si pad layer to recrystallize into a polycrystalline layer.

Steps (g2), (h2) and (i2) imply that the end device is intended for CMOS applications. However, if only NMOS or PMOS devices are desired, then these three steps can be consolidated into a single step as follows: depositing a doped α-Si region that fills the trench and overlaps the top of the stack.

EXAMPLE

This example describes the fabrication a significant portion of an UTB-VRG-MOSFET of the type shown in FIG. 1, in accordance with one embodiment of our invention. Various materials, dimensions and operating conditions are provided by way of illustration only and, unless otherwise expressly stated, are not intended to limit the scope of the invention.

More specifically, the UTB-VRG-MOSFET of this example was fabricated by first forming a VRG stack and trench as depicted in FIG. 2. Then, in accordance with this example, an ultra thin (5–20 nm), undoped α-Si layer 40.1

(FIG. 7) was deposited in the trench and on a portion of the top surface of the stack. Next, a relatively thick (70 nm) sacrificial, doped α-Si layer 42.1 was deposited on the ultra thin layer 40.1 to facilitate recrystallization into x-Si. The sacrificial layer was doped with P to about $1-4\times10^{20}$ cm$^{-3}$. The stack was then annealed at 575° C. in a nitrogen atmosphere for 2 hr. to recrystallize the amorphous layers into x-Si. The recrystallization extended vertically out of the trench and laterally a few micrometers, as indicated by the position of recrystallization front 50 (FIG. 8). The recrystallized (now x-Si) doped and undoped layers are designated 42.2 and 40.2, respectively, in FIG. 8. The doped x-Si sacrificial layer 42.2 was selectively removed with HNA, which had greater than 60:1 selectivity. This selective etching step left behind the undoped x-Si layer 40, as shown in FIG. 9.

We used P to dope the sacrificial layer because it is known to suppress random nucleation and to enhance SPE velocity (i.e., the rate at which the recrystallization front moves). We measured the undesirable diffusion of P into the undoped layer 40 during SPE anneal by depositing 50 nm of undoped α-Si on top of 70 nm of P-doped α-Si and then annealing in a nitrogen atmosphere for 1 hr. at 575° C. (This order of the layers minimized knock-on and mixing effects in SIMS.) Our SIMS data showed that P diffused less than 2 nm at a doping level of $1\times10^{18}$ cm$^{-3}$ and above. In the MOSFET devices, HNA etching of the doped layer 42.2, and a slight overetch to remove an abrupt diffusion tail, left minimal dopant in the remaining film while retaining precise thickness control. Since the diffusion at 575° C. was only a concern while layers 40.1 and 42.1 remained amorphous (<15 min. based on the measured SPE velocity of >1 μm/hr.), the above conclusions are quite conservative.

Top-down optical micrographs taken after SSPE indicated that the bottom of the trench acted as a seed for recrystallization, and that the ultra thin x-Si layer appeared as a diamond-shaped region surrounding the trench. A small degree of random nucleation was observed, but was deemed to be inconsequential for the UTB-VRG-MOSFET.

In one exemplary sample, TEM images showed a 10 nm layer 40 formed by our SSPE technique. Convergent-beam diffraction confirmed that the portion of ultra thin x-Si layer 40 on top of the VRG stack, at a lateral distance of 0.5 μm on both sides the trench, was single crystal with the same orientation as the substrate 14. These images demonstrated that our SSPE process is capable of creating x-Si layers with high aspect ratio (lateral layer width/final layer thickness; e.g., >200:1) and can provide the ultra thin x-Si needed in the active region of UTB-VRG-MOSFETs.

We used SSPE to fabricate a 15 nm thick x-Si layer with >200:1 aspect ratio. In addition, we used SSPE to fabricate the UTBs and back oxide of a device that could readily be completed as an UTB-VRG-MOSFET of the type shown in FIG. 1. The device had a 14 nm thick x-Si UTB 20.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, although we have used the terms doped and undoped to differentiate the amorphous Si layers deposited in the trench of the VRG structure, it is important that these layers have sufficiently different etch rates that the sacrificial layer can be selectively removed in the presence of the ultra thin layer after recrystallization and that the sacrificial layer facilitate the recrystallization of the underlying ultra thin layer.

In summary, our invention demonstrates the use of a novel SSPE process can be used to realize a FD-UTB-VRG-MOSFET. This MOSFET combines the excellent electrostatic scalability of UTB devices with a deposition-defined body thickness and gate length, enabling precise control of these important device dimensions.

We claim:

1. A method of fabricating an ultra thin body (UTB) vertical replacement gate (VRG) MOSFET comprising the steps of:
   (a) forming a VRG stack of layers on a substrate,
   (b) forming a trench in the stack, the trench exposing a portion of the substrate,
   (c) forming an ultra thin, amorphous semiconductor layer on the sidewalls of the trench,
   (d) forming a thicker amorphous semiconductor sacrificial layer on the ultra thin layer, the sacrificial and ultra thin layers having sufficiently different etch rates after step (e) that the sacrificial layer can be selectively removed in the presence of the ultra thin layer and the sacrificial layer being of sufficient thickness to insure that the ultra thin layer recrystallizes into single crystal material in step (e),
   (e) annealing the amorphous semiconductor layers to form a recrystallized single crystal ultra thin layer and a recrystallized single crystal sacrificial layer,
   (f) selectively removing the single crystal sacrificial layer, and
   (g) performing additional steps to complete the MOSFET.

2. The method of claim 1, wherein steps (c) and (d) form the ultra thin layer as an undoped layer and the sacrificial layer as a doped layer, respectively.

3. The method of claim 1 wherein in step (d) the sacrificial layer is sufficiently thick that the total thickness of the sacrificial and ultra thin layers is at least about 50 nm.

4. The method of claim 3 wherein the total thickness is at least about 80 nm.

5. The method of claim 1 wherein step (g) includes forming a thermal oxide on the trench side of the ultra thin single crystal layer.

6. The method of claim 5, wherein step (g) includes filling the trench with a silicon oxide region.

7. The method of claim 5, wherein step (g) includes forming a thin oxide layer on the recrystallized ultra thin layer and then filling the remainder of the trench with a silicon oxide region.

8. The method of claim 1 wherein said semiconductor is selected from the group consisting of Si, SiGe and Ge.

9. The method of claim 1, wherein in step (e) the ultra thin layer also overlaps the top of the VRG stack, the stack includes at least one doped layer, and step (g) includes the steps of: (g1) growing a thin thermal oxide on the ultra thin single crystal layer; (g2) depositing an oxide region to fill the remainder of the trench and overlay the top of the stack; (g3) planarizing the portions of the following regions that overlay the top of the stack: the oxide region and the ultra thin single crystal layer, so that they are essentially flush with the top of the stack; (g4) depositing an amorphous semiconductor pad layer over the top of the stack; (g5) ion implanting the pad layer; and (g6) annealing to cause dopants to diffuse from the at least one doped layer of the VRG stack into the portions of the ultra thin single crystal layer to form source/drain extensions therein.

10. The method of claim 9 including the step of ion implanting portions of the ultra thin layer that are to become the UTBs of the MOSFET.

11. The method of claim 1, wherein in step (e) the ultra thin layer also overlaps the top of the VRG stack, the stack includes at least one doped layer and step (g) includes the steps of: (g1) growing a thin thermal oxide layer on the ultra thin single crystal layer; (g2) depositing a thin back oxide layer on the thermal oxide layer and the on the top of the stack; (g3) depositing a thin amorphous semiconductor layer on the deposited oxide layer; (g4) ion implanting the thin amorphous layer; (g5) depositing an undoped amorphous semiconductor region that fills the remainder of the trench and overlays the top of the stack; (g6) planarizing the portions of the following regions that overlay the top of the stack: the ultra thin single crystal layer, the back oxide layer, the doped amorphous semiconductor layer, and the undoped amorphous semiconductor layer, so that they are essentially flush with the top of the stack; (g7) annealing to cause dopants to diffuse from the at least one doped layer of the VRG stack into the portions of the ultra thin single crystal layer to form source/drain extensions therein and to cause the amorphous semiconductor in the trench to recrystallize into a polycrystalline layer; (g8) depositing an amorphous semiconductor pad layer over the top of the stack; (g9) ion implanting the pad layer; (g10) performing subsequent processing steps to complete the MOSFET at least one of which causes the pad layer to recrystallize into a polycrystalline layer.

12. The method of claim 11 further including, after the planarizing step (g6), the additional step of ion implanting portions of the ultra thin single crystal layer that correspond to the UTBs of the MOSFET.

13. The method of claim 1, wherein in step (e) the ultra thin layer also overlaps the top of the VRG stack, the stack includes at least one doped layer and step (g) includes the steps of: (g1) growing a thin thermal oxide layer on the ultra thin single crystal layer; (g2) depositing a thin back oxide layer on the thermal oxide layer and the on the top of the stack; (g3) depositing a doped amorphous semiconductor region that fills the trench and overlays the top of the stack; (g4) planarizing the portions of the following regions that overlay the top of the stack: the ultra thin single crystal layer, the back oxide layer, the doped amorphous semiconductor layer, and the undoped amorphous semiconductor layer, so that they are essentially flush with the top of the stack; (g5) annealing to cause dopants to diffuse from the at least one doped layer of the VRG stack into the portions of the ultra thin single crystal layer to form source/drain extensions therein and to cause the amorphous semiconductor in the trench to recrystallize into a polycrystalline layer; (g6) depositing an amorphous semiconductor pad layer over the top of the stack; (g7) ion implanting the pad layer; (g8) performing subsequent processing steps to complete the MOSFET at least one of which causes the pad layer to recrystallize into a polycrystalline layer.

14. The method of claim 13 further including, after the planarizing step (g4), the additional step of ion implanting portions of the ultra thin single crystal layer that correspond to the UTBs of the MOSFET.

15. The method of claim 1 wherein the stack includes a gate layer and the thickness of the ultra thin layer is less than about one third the thickness of a gate layer.

* * * * *